United States Patent [19]

Koshimo et al.

[11] 3,884,702

[45] May 20, 1975

[54] PHOTOSENSITIVE POLYAMIDE COMPOSITION

[75] Inventors: Akio Koshimo; Kosuke Tomita; Kunihiko Takagi; Minoru Mitsui; Kunihiro Isikawa, all of Kyoto, Japan

[73] Assignee: Unitika, Ltd., Amagasaki-shi, Hyogo, Japan

[22] Filed: Dec. 14, 1972

[21] Appl. No.: 315,058

[52] U.S. Cl. .................. 96/115 P; 96/35.1; 96/36.3; 204/159.15; 260/89.7 R

[51] Int. Cl. ................................................ G03c 1/68

[58] Field of Search ............. 96/115 R, 115 P, 35.1, 96/36.3; 204/159.15; 260/89.7

[56] References Cited

UNITED STATES PATENTS

| | | | |
|---|---|---|---|
| 3,066,117 | 11/1962 | Thoma et al. | 96/115 R |
| 3,174,860 | 3/1965 | Sus et al. | 96/115 R |
| 3,330,659 | 7/1967 | Wainer | 96/115 R |
| 3,486,891 | 12/1969 | Wilhelm et al. | 96/115 R |
| 3,549,366 | 12/1970 | Margerum | 96/115 P |
| 3,595,664 | 7/1971 | Rust | 96/115 R |
| 3,637,375 | 1/1972 | Levinos | 96/35.1 |
| 3,690,890 | 9/1972 | Yamaguchi et al. | 96/115 R |
| 3,711,244 | 1/1973 | Sayigh et al. | 96/115 R |
| 3,725,231 | 4/1973 | Jahnke | 96/115 P |
| 3,725,356 | 4/1973 | Luders et al. | 96/115 P |
| 3,732,105 | 5/1973 | Klupfel et al. | 96/115 P |
| 3,737,319 | 6/1973 | Borden | 96/115 R |
| 3,754,911 | 8/1973 | Jones | 96/115 R |
| 3,763,118 | 10/1973 | Ulrich et al. | 96/115 R |

*Primary Examiner*—Norman G. Torchin
*Assistant Examiner*—Edward C. Kimlin
*Attorney, Agent, or Firm*—Sughrue, Rothwell, Mion, Zinn & Macpeak

[57] ABSTRACT

A photosensitive polyamide composition comprising a polyamide having pendant sulfonate salt groups, an unsaturated compound having at least two polymerizable ethylenic double bonds and a photoinitiator. A water-developable printing plate made therefrom.

21 Claims, No Drawings

PHOTOSENSITIVE POLYAMIDE COMPOSITION

BACKGROUND OF THE INVENTION

1. Field of the Invention

This invention relates to a novel photosensitive polyamide composition. More specifically, it relates to a photosensitive polyamide composition comprising a polyamide having pendant sulfonate salt groups, an unsaturated compound having at least two polymerizable ethylenic double bonds and a photoinitiator, and to a water-developable printing plate made therefrom.

2. Description of the Prior Art

It is known that a composition comprising a soluble copolyamide as a resin component, an unsaturated compound having polymerizable double bonds and a photoinitiator undergoes a crosslinking reaction upon irradiation with light and becomes insoluble.

It is also known that a printing plate can be produced by subjecting a photosensitive resin plate prepared by bonding such a composition to a suitable support to light irradiation through an image-bearing transparency and removing the unexposed areas using a suitable solvent.

Printing plates based on polyamides have better resistance to printing than conventional metal printing plates because of their superior abrasion resistance, and also prove suitable for rotary press usage due to their good elasticity. Furthermore, the amide linkage of the polyamide contributes to good link receptivity and provides a clear finish. However, polyamide resins which have previously been used for forming printing reliefs are soluble only in organic solvents, and therefore to remove unexposed areas, organic solvents must be used. This complicates the overall working process including development, and poses safety problems and health hazards. Moreover, the use of such organic solvents is economically disadvantageous.

SUMMARY OF THE INVENTION

Accordingly, one object of this invention is to provide a photosensitive polyamide composition which is soluble in water or which can be dispersed as a colloid in water. The completely soluble forms form a transparent solution, whereas a coloidal dispersion will be semitransparent or opaque.

Another object of this invention is to provide a photosensitive polyamide composition for use in preparing a waterwashable printing plate. The terms "washable" and "developable" will be used interchangeably.

Still another object of this invention is to provide a printing plate having good printing resistance and ink receptivity.

A further object of this invention is to provide a composition and a printing plate which have good storage stability for prolonged periods of time.

Extensive work of the inventors in an attempt to achieve the above objects has led to the discovery of a novel photosensitive polyamide composition capable of giving a printing plate which has good storage stability for prolonged periods of time and good resolving power, which can be easily developed with water and which can be produced at low cost.

Accoring to the present invention, there is provided a photosensitive polyamide composition comprising at least one polyamide having pendant sulfonate salt groups, at least one compound having at least two polymerizable ethylenic double bonds and at least one photoinitiator.

DETAILED DESCRIPTION OF THE INVENTION

The polyamide having pendant sulfonate salt groups can be prepared by reacting a polyfunctional compound having a sulfonate salt group with a polyamide-forming reactant which generally is free of sulfonate salt groups.

For example, it can be obtained by reacting the polyamide-forming reactant at a high temperature with a compound having a triazine ring which is expressed by the following formula

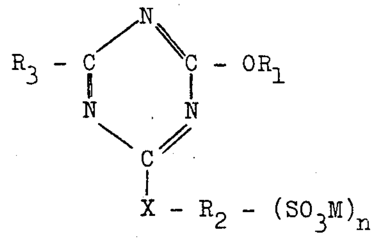

wherein $R_1$ is a monovalent aromatic group having one to 10 carbon atoms, $R_2$ is an $(n + 1)$ valent aromatic group or divalent aliphatic group having one to 10 carbon atoms, X is NH, $NR_4$(wherein $R_4$ is a monovalent aliphatic group having one to five carbon atoms), an oxygen atom or nothing, $n$ is an integer of 1 to 3 and is 1 when $R_2$ is divalent, 2 when $R_2$ is trivalent and 3 when $R_2$ is tetravalent, M is an alkali metal, an ammonium group, or an ammonium salt substituted by 1 to 4 aliphatic groups or aromatic groups having one to eight carbon atoms and $R_3$ is $OR_1$ (wherein $R_1$ is as defined above) or OH. Preferred triazine ring compounds are those wherein $R_1$ has one to 10 carbon atoms and is a phenyl radical or naphthyl radical containing one to 5 groups selected from the group consisting of alkyl, halogen, alkoxy and nitro groups, when $R_2$ is divalent it is phenylene, xylene or a straight or branched chain alkylene group, and when $R_2$ is trivalent it is benzyltriyl having one to 10 carbon atoms.

Specific examples of triazine compounds of the above formula are 2,4-diphenoxy-6-[p-(sodium sulfo)-phenylamino]-s-triazine, 2-hydroxy-4-phenoxy-6-[p-(sodium sulfo)phenylamino]-s-triazine, 2-hydroxy-4-(p-tert.-butylphenoxy-6-[p-(sodium sulfo) phenylamino]-s-triazine, 2,4-diphenoxy-6-[p-(sodium sulfo)phenoxy]-s-triazine, 2,4-diphenoxy-6-[2',4'-(disodium sulfo)phenylamino]-s-triazine and 2,4-diphenoxy-6-[β-(sodium sulfo)ethylamino]-s-triazine. Potassium, tetramethyl ammonium and trimethylbenzyl ammonium salts may also be used instead of the sodium salts.

The polyamide having pendant sulfonate salt groups used in the present invention can also be prepared by reacting the polyamide-forming reactant at a high temperature with an aromatic or aliphatic sulfonate salt having two amide-forming functional groups before the completion of the polycondensation reaction. Examples of aromatic sulfonate salts having polyamide-forming functional groups are sodium 2,5- and 3,5-dicarboxybenzenesulfonates, sodium 2,5- and 3,5-di(-carboxymethyl) benzenesulfonates, sodium 2,5- and 3,5-di(carbomethoxy)benzenesulfonates, sodium 2,5- and 3,5-di(carbomethoxymethyl)benzenesulfonates, sodium 2,5- and 3,5-di(aminomethyl)benzenesulfonates, and sodium 2,5- and 3,5-di(β -aminoethyl)benzenesulfonates, and the corresponding potassium, tetramethyl ammonium and trimethylbenzyl ammonium salts. On the other hand, examples of the aliphatic sulfonate salts having amideforming functional groups are alpha-(sodium-and potassium sulfo) succinic acids, dimethyl alpha-(sodium-and potassium sulfo) succinates, beta-(sodium-and potassium sulfo)adipic acids, dimethyl beta-(sodium-and potassium sulfo)adipates, and alpha-(gamma-sodiumand potassium sulfopropyl-)amino-epsilon caprolactam, and the corresponding tetramethyl ammonium and trimethylbenzyl ammonium salts.

Preferred aromatic or aliphatic sulfonate salts containing two amide-forming functional groups can be represented by one of the following general formulae:

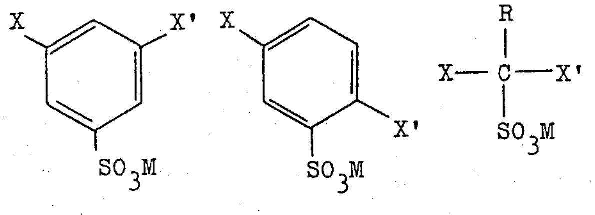

wherein M is an alkali metal, an ammonium group or an ammonium group substituted by 1 to 4 aliphatic groups or aromatic groups having one to eight carbon atoms;

R is a hydrogen atom or an alkyl group having one to five carbon atoms X & X' are amide forming functional groups, most preferably:

COOH, RCOOH (R is a $C_1$~$C_5$ alkylene group)

COOR (R is a $C_1$~$C_5$ alkyl group)

RCOOR' (R is a $C_1$~$C_5$ alkylene group and R' is a $C_1$~$C_5$ alkyl group) and $RNH_2$ (R is a $C_1$~$C_5$ alkylene group).

If the amount of the sulfonate salt containing a triazine ring or the sulfonate salt containing amide-forming functional groups is small, it does not greatly contribute to the solubility or colloidal dispersibility in water of the resulting polyamide, while on the other hand, if it is too large, a polyamide having a high molecular weight cannot be obtained with ease. It is desirable therefore that such a compound should be used in an amount of 2 to 50 mol percent, especially 4 to 25 mol percent, in the copolymer, the balance (50 to 98 mol percent) being polyamide-forming reactant. These same ratios apply to the reaction system per se.

Specific examples of polyamide-forming reactants are a monoaminomonocarboxylic acid, and an equimolar mixture of a diamine a dicarboxylic acid, which have already been known in the art. Preferred polyamide forming reactants are dicarboxylic acids having two to 16 carbon atoms, monoaminomonocarboxylic acids having two to 16 carbon atoms and diamines having two to 14 carbon atoms. Examples of the monoaminomocarboxylic acid are 6-aminocaproic acid, 7-aminoenanthylic acid, 9-aminononanoic acid, and 11-aminoundecanoic acid. Examples of the diamine are ethylene diamine, propylene diamine, tetramethylene diamine, pentamethylene diamine, hexamethylene diamine, octamethylene diamine, decamethylene diamine, m and p-xylylene diamines, m- and p-phenylene diamines, hexahydro-m- and p-phenylene diamines, and piperazine. Examples of the dicarboxylic acid are sebacic acid, adipic acid, azelaic acid, suberic acid, p-phenylene diacetic acid, isophthalic acid, terephthalic acid, and oxydibutanoic acid.

Instead of the monoaminomonocarboxylic acid, diamine and dicarboxylic acid, the amide-forming derivatives thereof may be used. Examples of the amide-forming derivatives of the monoaminomonocarboxylic acid are esters, anhydrides, amides, lactams, acid halides, N-formyl derivatives, carbamates and nitriles (in the presence of water). The amide-forming derivatives of the diamine include carbamates and N-formyl derivatives. The amide-forming derivatives of the dicarboxylic acids include mono- and di-esters mono- and diamides and acid halides. Preferred derivatives within the above classes are:

1. esters such as lower alkyl esters having one to five carbon atoms or a phenyl ester;
2. anhydrides such as an anhydride having a five or six-membered ring
3. amides such as an N-substituted amide, i.e., by an alkyl group having one to five carbon atoms;
4. lactams such as lactams having a four to seven membered ring;
5. halides such as a chloride or bromide;
6. carbamates such as a lower alkyl carbamate havine one to five carbon atoms;
7. nitriles such as a nitrile which is hydrolyzed in the presence of water.

Examples of the above derivatives are diethyl adipate, monoethyl adipate, methyl 6-amino-caproate, succinic anhydride, N, N'-diethyl adipamide, N-methyl 6-aminocapramide, 6-caprolactam, sebacic dichloride, 6-aminocapronitrile and N-ethyl carbamoyl-6-aminocaproic acid.

The polyamide used in this invention preferably has a molecular weight of 2,000 to 40,000, especially 5,000 to 15,000.

Especially useful polyamides are copolyamides composed of 35 to 70 percent by weight of Nylon 6 (poly (ε-capramide)), 10 to 40 percent by weight of Nylon 66 (poly hexamethyleneadipamide) and 15 to 50 percent by weight of poly hexamethylene (5-sodiumsulfo)isophthalamide.

The pendant sulfonate groups are highly hydrophilic. Accordingly, by introducing such groups into the polyamide the hydrophilicity of the polyamide is raised, and the polyamide can be water soluble or dispersable in a colloidal state in water.

Preferred pendant sulfonate groups can be represented by the formula $—SO_3M$ where M is an alkali metal such as lithium, sodium, potassium etc., an ammonium group or an ammonium salt such as triethyl ammonium, tetramethyl ammonium, trimethylbenzyl ammonium, etc., which has one to eight carbon atoms and which can be substituted by 1–4 alkyl or aromatic groups.

The amount of polyamide is preferably 30 to 99 percent by weight based on the total weight of the composition. If the amount of polyamide is over 99 percent, the amount of unsaturated compound having at least two polymerizable ethylenic double bonds and photoinitiator is less than 1 percent, and accordingly the time necessary to render the composition insoluble is greatly increased and the composition is not practical for use. On the other hand, if the amount of polyamide is less than 30 percent, the mechanical strength of the composition after exposure is low.

A wide variety of unsaturated compounds having at least two polymerizable ethylenic double bonds can be used in the present invention. While the exact function of the unsaturated compound is not entirely clear, its presence is necessary to obtain an insoluble composition.

While the inventors do not wish to be bound by the following theories, one theory is that the unsaturated compounds are polymerized, networks are formed, the polyamide is surrounded in the networks and the composition is rendered insoluble. Another theory is that simultaneously with polymerizing the unsaturated compounds, hydrogen atoms of the polyamide are extracted by radicals and the unsaturated compounds and polyamides are chemically combined into a network structure, whereby the composition is rendered insoluble. In either case, the presence of unsaturated compounds is necessary. Those unsaturated compounds having at least two polymerizable ethylenic double bonds having good solubility in water (uniformly soluble in a water, transparent and no phase separation occurs) and/or alcohols, e.g., such as an methanol, ethanol, n-propanol, isopropanol etc., solution and having good compatibility with the polyamide component are especially preferred. Good compatibility means that after mixing with the resin component the appearance is transparent and phase separation is not observed.

Examples of preferred unsaturated compounds are those represented by the formula:

$$CH_2 = \underset{R}{C} - \underset{O}{\overset{}{C}} - \underset{H}{N} - X - \underset{H}{N} - \underset{O}{C} - \underset{R'}{C} = CH_2$$

wherein X is a divalent group having an aliphatic, alicyclic or aromatic group with 1 to 10 carbon atoms, and R and R' are a hydrogen atom or a lower alkyl group having 1 to 5 carbon atoms with preferred X groups being those wherein the number of straight-chain carbon atoms combining two amide groups and two nitrogen atoms is less than eight, but where residual carbon atoms, i.e., total carbons would be more than eight, may be present at a side chain position, e.g.:

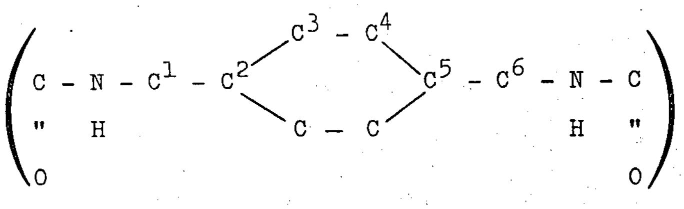

and those represented by the formula:

$$CH_2 = \underset{R}{C} - \underset{O}{C} - \underset{H}{N} - X - O - \underset{O}{C} - \underset{R'}{C} = CH_2$$

wherein X is a divalent aliphatic, alicyclic or aromatic group having one to eight carbon atoms, and R and R' are a hydrogen atom or a lower alkyl group having one to five carbon atoms, with preferred X groups being those wherein the number of straight-chain carbon atoms combining two amide groups and two nitrogen atoms is less than 6, where residual carbon atoms to render the total more than eight may be present at the position of side chains.

Diacrylates and dimethacrylates of glycols such as ethylene glycol, propylene glycol, diethylene glycol, triethylene glycol etc., are also preferred unsaturated compounds that can be used in the present invention, i.e., diacrylated or dimethacrylated at the OH groups at both ends of the glycol, for example, ethylene glycol diacrylate $$CH_2 = CH\underset{O}{C}OCH_2CH_2O\underset{O}{C}CH = CH_2$$

diethylene glycol diacrylate $$CH_2 = CH\underset{O}{C}OCH_2CH_2CCH_2CH_2O\underset{O}{C}CH = CH_2$$

Examples of other preferred unsaturated compounds are bisacrylamide and bismethacrylamide of nylon oligomers having terminal amino groups at both ends. Such materials may also be described as compounds in which two terminal amino groups of a nylon oligomer are acrylated, i.e., a nylon oligomer:

$$H_2N(CH_2)_6\underset{O}{\overset{}{\underset{H}{N}C}}(CH_2)_5NH_2$$

a bisacrylamide of the nylon oligomer:

$$CH_2 = CH\underset{O}{C}\underset{H}{N}(CH_2)_6\underset{H}{N}\underset{O}{C}(CH_2)_5\underset{H}{N}\underset{O}{C}CH = CH_2$$

Nylon oligomers may broadly be described as lower polymerized compounds having one or more amide bonds connected to alkylene and phenylene groups in the molecular chain(s).

Specific examples of especially useful unsaturated compounds having at least two polymerizable ethylenic double bonds include N,N'-methylenebisacrylamide, N,N'-m and p-xylylenebisacrylamides, N,N'-m and p-xylylenebismethacrylamides, N,N'-hexamethylenebisacrylamide, N,N'-hexamethylenebismethacrylamide, cis- and trans1,4-diacryloylaminomethylcyclohexanes, N,N'-m- and p-phenylenebisacrylamides, N,N'-m and p-phenylenebismethacrylamides, O,N-diacryloyl m- and p-aminophenols, O,N-dimethacryloyl-m and p-aminophenols ethylene glycol diacrylate and dimethacrylate, diethylene glycol diacrylate and dimethacrylate, triethylene glycol diacrylate and dimethacrylate. Examples of compounds having 3 or 4 polymerizable ethylenic double bonds which can be used are tri(N-acryloyl) hexahydrotriazine, tri(N-methacryloyl) hexahydrotriazine, pentacrythrytol tetraacrylate and tetramethacrylate, and glycerol triacrylate and trimethacrylate.

The presence of an electron-attracting group, and such as a carbonyl or sulfo group, which lies next to a double bond is preferred.

The amount of the above unsaturated compounds, used either alone or in admixture, is 1 to 70 percent by weight, preferably 5 to 50 percent by weight of the composition, depending upon their compatibility with the polyamide component, their solubility in water and their reactivity. When the proportion of the unsaturated compounds is less than 1 percent by weight, the rate of polymerization is very slow and and the mechanical strength after irradiation is low. When the proportion is more than 70 percent by weight the elasticity after irradiation is impaired. As a general rule the unsaturated compounds contain no more than four polymerizable ethylenic double bonds.

The photoinitiator which is used to promote the photopolymerization reaction can be any art recognized material as is used for that purpose, e.g., organic peroxides such as benzoyl peroxide, azo compounds such as azobisisobutyronitrile and diphenyl azomethane, compounds having a benzoyl radicals such as benzophenone, benzoin, benzoin methyl ether, benzoyl benzophenone and p-aminobenzophenone, quinones such as 9, 10-anthraquinone, and nitro compounds such as p-nitroaniline and picramide. The exact photoinitiator selected is not overly critical and materials other than those recited can also be used, e.g., anthracene, 1,2-benzoanthraquinone and the like. The amount of the photoinitiator is 0.01 to 10 percent by weight based on the composition. When the amount of the photoinitiator is less than 0.1 percent by weight, the photopolymerization reaction is too slow to be practically used. On the other hand, when more than 10 percent by weight of the photoinitiator is used, the mechanical strength after irradiation tends to be reduced.

In order to improve the stability of the composition during fabrication and storage, it is desirable to add a polymerization inhibitor to the composition. The function of the inhibitor is to prevent a radical polymerization by scavenging radical species which occur thermally or mechanochemically during fabrication and storage.

The inhibitor can be selected from those known to the art, e.g., phenols, hydroquinones, gallic acids, aromatic amines, quinones and coloring materials. Preferred inhibitors are phenols such as p-methoxy phenol and p-cresol, hydroquinones such as hydroquinone and di-tert-butylhydroquinone (e.g., the 2, 5-form), gallic acids such as gallic acid, n-propyl gallate and iso-amyl gallate, aromatic amines such as naphthyl amine, quinones such as benzoquinone or coloring materials such as Methylene Blue and Malachite Green. The polymerization inhibitor is added in an amount effective for inhibiting thermal polymerization in the dark, but insufficient to hinder photopolymerization. The amount of the polymerization inhibitor employed will usually be in the range of 0.005 to 2 percent by weight based on the weight of the total composition.

If desired, the photosensitive polyamide composition of this invention may contain an unsaturated compound having one polymerizable ethylenic double bond, which compound increases the rate or extent of the crosslinking reaction and facilitates the removal of the unexposed areas. Preferably, the unsaturated compound having one polymerizable ethylenic double bond has a boiling point greater than 100°C at 1 atm. and a molecular weight of less than 1,000. Further, the degree of polymerization of such compounds having next to the ethylenic double bond electron-attracting group(s) such as a carbonyl, cyan and sulfo groups is high. The difference between an unsaturated compound having one polymerizable ethylenic double bond and an unsaturated compound having at least two polymerizable ethylenic double bonds is that the former per se can be polymerized but little crosslinking reaction occurs. Accordingly, during the use of the former, it is necessary to add the latter. Examples of such a compound are acrylamide, N-methylolacrylamide, N-tert-butylacrylamide, diacetone acrylamide, beta-hydroxyethyl acrylate, beta-hydroxyethyl methacrylate, triethylene glycol monoacrylate an triethylene glycol monomethacrylate. Preferably, this unsaturated compound is used in an amount of 1 to 50 percent by weight, based on the total composition weight. When the amount of the above unsaturated compound is less than 1 percent by weight based on the composition, the above mentioned effects are not achieved. On the other hand, when more than 50 percent by weight of the unsaturated compound is used the mechanical properties after irradiation are impaired.

The photosensitive polyamide composition of this invention can be prepared from the individual ingredients described above by any conventional method such as milling, mixing or a solution technique using, if desired, a solvent for all components such as water, methanol or a mixture of water and methanol. The resulting homogeneous composition is fabricated into a sheet or laminated structure of the desired thickness by a method such as solvent-casting or extrusion.

The sheet or laminated structure made of the photosensitive composition of this invention can be bonded to a support such as a flexible film, stiff sheet or plate (which may be planar or curved) using an adhesive, if desired. The appropriate adhesive to be used varies with the kind of support, but commercially available epoxy and urethane adhesives are especially preferred because they can be used with a wide range of supports. Alternatively, a solution, dispersion or melt of the photosensitive composition may be coated on the support to form a resin plate. The thickness of the photosensitive resin layer differs according to the type of printing desired, such as relief, dry offset or offset printing but is usually about 3 to 2,000 microns. Preferred thicknesses for special applications are: for "offset" work: $2\sim10\mu$; for "dry offset" work: $50\sim300\mu$;

and for

"relief" work: $300\sim2,000\mu$.

As the support, there can be used high-molecular-weight compounds such as vinyl polymers or polycondensation polymers, or metals such as aluminum or steel, from which films or sheets can be formed. The support may be porous. For example, it may be a metal screen, a screen produced from synthetic fibers or a silk screen. A fibrous laminate can also be used.

A printing plate is produced from such a photosensitive laminate by exposing the laminate to actinic light through an image-bearing transparency or stencil. Crosslinking occurs at the exposed areas and these areas become insoluble in solvent, but the unexposed areas do not undergo this phenomenon and remain soluble in solvent.

The source of actinic light may, for example, be a carbon arc lamp, a mercury vapor arc lamp, a fluorescent lamp yielding ultraviolet light, an argon glow lamp or a photographic flood lamp. The most effective wave length of the actinic light is in the range 2,000 to 5,000A. One skilled in the art will easily be able to determine appropriate exposure conditions, for example with a 4,000 W mercury vapor arc lamp 80 cm from the element to be exposed, the element having a thickness of 1. less than $50\mu$: $5\sim30$ seconds;
2. $50\sim400\mu$; 10 seconds~2 minutes;
3. $400\sim2,000\mu$: 30 seconds~5 minutes.

If the support is too reflective, the light which has passed through the transparent portion of the image bearing transparency is reflected by the support and tends to cause crosslinking of non-image areas. It is desirable, therefore, to provide a light-absorbing layer or antihalation layer between the photosensitive polyamide layer and the support. A dispersion or solution of a suitable dye or pigment in a resin having adherence to the support may be used to provide such a layer. For example, suitable dyes and pigments are Azo Dyes such as Sky Blue 6B,
Anthraquinone Dyes such as Anthraquinone Violet,
Indigoid Dyes such as Indigo,
Diphenylmethane Dyes such as Victorian Blue B, Xanthane Dyes such as Erythrosine,
Azine Dyes such as Safranine T,
Oxazine Dyes such as Nile Blue,
Cyanine Dyes such as Cyanine Blue,
Quinoline Dyes such as Quinoline Yellow and
Naphthoquinone Dyes such as Alizarin Black.

The unexposed area of the photosensitive polyamide layer is then removed by washing out with a solvent (this operation is also called developing) to thereby form a printing plate. Advantageously, water can be used as this solvent in the present invention. There can also be used an organic solvent such as methanol or a mixed solvent such as a mixture of water and methanol. Useful solvents, in addition to those recited, generaly include alcohols and glycols ($C_1 \sim C_4$), acetone, dioxane and tetrahydrofuran. For mixed solvent systems, any uniform mixture with water, i.e., water/organic solvent of any proportion, can be used. Water/methanol, water/ethanol and water/propanol are preferred.

In the washing procedure, the solvent such as water may be applied to the photosensitive layer by any convenient method as by pouring the water on the layer, immersing the layer in water or spraying the layer with water. Brushing also promotes the removal of the unexposed areas. The temperature of developing or washing should be less than the boiling point of the solvent per se at 1 atm and less than an azeotropic point of any solvents at 1 atm, if such solvents form an azeotrope.

The temperature of the solvent may be room temperature, but a warm solvent kept at 40°–50°C. gives better effects, especially when water is used.

The photosensitive polyamide composition of this invention can be used for a variety of purposes, for example, as a material for relief printing, offset printing or dry offset printing. It can also be applied by the silk screen process. Furthermore, the printing plate produced in this invention can be used for multicolor printing.

The photosensitive polyamide composition has the advantage that because of its water washability it is simple to work and safe to process, and moreover offers economical merits. Furthermore, images obtained using this composition are very sharp, and show fidelity to the original transparency both in small details and in overall dimensions. Further, the printing plate prepared from the photosensitive polyamide composition has high impact strength and very high abrasion resistance, and is tough without being brittle. Another advantage is that it is not affected by printing ink and cleaning solutions.

The main use of the photosensitive polyamide composition of this invention will be as a water-washable printing plate material, but it finds use in many other applications, some examples of which will be shown below. It is do be understood that all of such uses are within the scope of this invention.

Since the photosensitive polyamide composition of this invention has good resistance to etching solutions for metals or inorganic materials as a result of exposure, it is also useful as a water-washable photoresist for metal working. In other words, it can be used for the production of metal printing plates, electronic materials, ornamental metal articles, etc.

Furthermore, it can be used as an aqueous paint by dispersing or dissolving a pigment, etc., into the composition. In preparing such aqueous paints, no organic solvents need be used, and therefore the use of the composition offers advantages with respect to safety and economy. After coating such a paint, it can be exposed to light to give a superior coating.

The folliwing Examples will serve to illustrate the invention but are not to be regarded as limiting it in any way:-

GENERAL EXAMPLE

Polyamides having pendant sulfonate group(s) can be produced as follows:

An autoclave is charged with predetermined amount of polyamide forming reactant, and sulfonate salt containing a triazine ring and/or sulfonate salt containing amide-forming functional groups. The temperature is raised to 150° to 280°C for 30 minutes to 3 hours, and the contents stirred in a flowing nitrogen stream (or after purging the autoclave with nitrogen, the autoclave may be sealed). Then, reaction is conducted for one to six hours (if the autoclave was sealed, releasing of the pressure to atmospheric is conducted for 5 minutes to 2 hours), at 150° to 280°C and at a normal pressure (if the autoclave was sealed, under reduced pressure of 50~500 mmHg, or pressure of 1~20 $Kg/cm^2$).

It is not necessary to charge the sulfonate salt with the polyamide forming reactant at the first step of the reaction, and the sulfonate may be charged at any step of the polycondensation reaction.

EXAMPLE 1

An autoclave was charged with 17 g of ε-caprolactam, 2 g of hexamethylene diamine, 10 g of 2-hydroxy-4-phenoxy-6-[p-(sodium sulfo) aminophenyl]-s-triazine and 1 g of ε-aminocaproic acid, and after purging the reactor with nitrogen, the contents were reacted for 5 hours at 250°C. and 30 atmospheres. The polyamide obtained was dissolved in a 50 percent aqueous solution of methanol, and the terminal amino groups were titrated with an aqueous solution of p-toluenesulfonic acid using Thymol Blue as in indicator. On the other hand, the terminal carboxyl groups were titrated with an aqueous solution of potassium hydroxide using phenolphthalein as an indicator. The molecular weight of the polyamide, calculated from the terminal group contents, was 4,200. (The molecular weight will be calculated in the same way hereinafter.)

20 g of this polyamide was dissolved in 200 ml. of 50 percent aqueous solution of methanol, and further, 3 g of N,N'-methylenebisacrylamide, 0.6 g of benzophenone and 0.06 g of Methylene Blue were added thereto to yield an homogeneous solution. The solvent 50 percent aqueous solution of methanol) was then removed to give a homogeneous solid composition. This composition was cut into granular form and dried for one day at room temperature. The dried product was then pressed at 100°C. and 100 $Kg/cm^2$ to form a sheet-like material having a thickness of 1 mm. The sheet-like material was bonded with an epoxy adhesive to a chromium plated plate, and exposed to photo-irradiation by a 400 W mercury lamp (60 cm from the plate) through a negative transparency for 5 minutes. After exposure, the laminated material was washed with water for 20 minutes, and there was obtained a relief having a very sharp image.

The above procedure was repeated except that instead of the 2-hydroxy-4-phenoxy-6-[p-(sodium sulfo)-aminophenyl]-s-triazine, the corresponding potassium or tetramethyl ammonium salt was used in preparing the polyamide. There was obtained a relief having a sharp image.

EXAMPLE 2

A reactor was charged with 67.8 g of ε-caprolactam, 6.05 g of hexamethylene diamine, 30.2 g of diphenoxy-6-[p-(potassium sulfo)phenylamino]-s-triazine and 3.9 g of ε-aminocaproic acid, and they were reacted with agitation at 250°C. at atmospheric pressure in a nitrogen stream flowing at a rate of 100 ml./min. After 3 hours, the reaction system pressure was reduced to 360 mmHg, and reaction was continued at this pressure for 2 hours. There was obtained a polyamide having a molecular weight of 6,000.

30 g of this polyamide was dissolved in 200 ml. of a 50 percent aqueous solution of methanol, and 3 g of N,N'-methylenebisacrylamide, 3 g of p-xylylenebisacrylamide, 0.2 g of benzoin methyl ether and 0.06 of Methylene Blue were further added thereto to yield a homogeneous solution. The solvent was removed and a solid homogeneous composition was obtained. The solid composition was cut into granular form and dried for one day at room temperature The dried product was then pressed at 100 Kg/cm$^2$ and 100°C. to form a sheet-like material having a thickness of 1 mm. The sheet-like material was bonded with an epoxy adhesive to an aluminum plate and exposed to photo-irradiation by a 400 W high pressure mercury arc lamp 60 cm from the plate through a negative transparency for 5 minutes. After exposure, the material was washed with flowing water for 20 minutes to give a relief having a sharp image. The same results were obtained when the above procedure was repeated using p-xylylenebismethacrylamide, m-xylylenebisacrylamide or m-xylylenebismethacrylamide instead of p-xylyenebisacrylamide.

EXAMPLE 3

A polyamide was prepared in the same way as in Example 1 by performing the reaction for 5 hours using 45.2 g of ε- caprolactam, 17.4 g of hexamethylene diamine, 68.7 g of 2,4-diphenoxy-6-[p-(sodium sulfo)-phenylamino]-s-triazine and 104.8 g of hexamethylene diammonium adipate. The polyamide obtained had a molecular weight of 6,300. A relief showing fidelity to a negative transparency was prepared using 30 g of this polyamide by the same method as set forth in Example 1.

EXAMPLE 4

An autoclave was charged with 90 g of ε-caprolactam, 105 g of hexamethylene diammonium adipate (Nylon 66 salt), 127 g of hexamethylene diammonium sebacate (Nylon 610 salt), 93 g of 2,4-diphenoxy-6-[p-(sodium sulfo) phenoxy]-s-triazine and 23.5 g of hexamethylene diamine. After purging with nitrogen, the autoclave was sealed. Reaction was at 250°C and 15 atmospheres. After two hours the pressure was released (i.e., reduced to atmospheric), and reaction was continued for an additional 3 hours at a pressure of 5 Kg/cm$^2$. There was obtained a polyamide having a molecular weight of 9,500.

Using 30 g of this polyamide, a relief showing fidelity to a negative transparency was prepared by the same method as in Example 1 except that 2 g of triethylene glycol diacrylate was used instead of the N,N'-methylenebisacrylamide. The above procedure was repeated except that instead of 2,4-diphenoxy-6-[p-(sodium sulfo)phenoxy]-s-triazine, the corresponding potassium salt was used in preparing a polyamide. There was again obtained a relief having a sharp image.

EXAMPLE 5

A polyamide having a molecular weight of 3,900 was prepared by the same method as in Example 1 using 113 g of ε-caprolactam, 18.6 g of hexamethylene diamine, 40.2 g of potassium 3,5-dicarboxybenzenesulfonate and 6.6 g of ε-aminocaproic acid.

Using 30 g of this polyamide, a relief showing fidelity to a negative transparency was prepared by the same method as in Example 1 except that 0.06 g of hydroquinone was used instead of the Methylene Blue.

EXAMPLE 6

A polyamide having a molecular weight of 5,900 was prepared by the same method as in Example 1 using 113 g of ε-caprolactam, 24,8 g of dimethyl α-(sodium sulfo)succinate and 11.6 g of hexamethylenediamine.

30 g of this polamide was dissolved in a 200 ml. of a 50 percent aqueous solution of methanol, and further, 3 g of N,N'-methylenebisacrylamide, 0.6 g of p,p'-di(dimethylamino)benzophenone and 0.06 g of Methylene Blue were added thereto to yield a homogeneous solution. The solvent was removed and a uniform composition obtained. This composition was cut into a granular form (about 1 mm × 3 mm × 3 mm), dried, and pressed into a sheetlike material by rolling at 140°C, 80 Kg/cm$^2$. The resulting sheet-like material was bonded with an epoxy adhesive to plate, and exposed to photoirradiation by a 800 W a zinc fluorescent are lamp 80 cm from the plate through a negative transparency for 5 minutes. After exposure, the material was washed with water to give a relief having a sharp image.

EXAMPLE 7

An autoclave was charged with 40 g of ε-caprolactam, 30 g of hexamethylene diammonium adipate and 30 g of hexamethylene diammonium (5-sodium sulfo) isophthalate, and purged with nitrogen. The temperature was raised to 240°–250°C. over 1 hour, and the polymerization was performed at this temperature for 4 hours at 30 Kg/cm$^2$, and, after releasing the pressure for 30 minutes, for 5 hours at atmospheric pressure at the same temperature. There was obtained a copolyamide having a molecular weight of 12,000. The percentages of the components in the copolymerized product did not differ from the ratio in the reactants charged to the autoclave.

60 g of this copolyamide, 6.0 g of N,N'-methylenebisacrylamide, 1,2 g of benzophenone and 0.06 g of hydroquinone were milled for 20 minutes using a Brabender plastograph. The resulting composition was pulverized in a grinder mill, dried and pressed at 100 Kg/cm$^2$ and 100°C. to form a sheet-like material. The sheet-like material was bonded with an epoxy adhesive to an aluminum plate, and exposed to photoirradiation by a 400 W carbon arc lamp through a resolving power test chart for 5 minutes while maintaining the distance between the sheet material and the lamp at 50 cm. The material was then developed for 2 minutes with tap water at 30°C. in a closed chamber at 8 Kg/cm$^2$ using a spraying machine. The number of straight lines per millimeter which could be discerned was made the resolving power. The resolving power of the relief obtained in this Example was 16.0/mm.

EXAMPLE 8

20 g of the copolyamide obtained in Example 7 was dissolved in 200 ml. of a 50 percent aqueous solution of methanol, and 3 g of N,N'-methylenebisacrylamide, 0.6 g of benzophenone and 0.02 g of gallic acid were added thereto. A photosensitive printing plate was prepared in the same way as in Example 7. The resolving power of the printing plate after 6 months and after one year was examined in the same way as in Example 7. It was found that at both times the resolving power was 16.0/mm.

For comparison, three photosensitive printing plates were prepared using the same copolyamide composition except the first contained 0.02 g of hydroquinone instead of gallic acid, the second contained 0.02 g of Methylene Blue instead of gallic acid and the third contained no polymerization inhibitor at all. The resolving power of each printing plate was examined after 6 months and after one year. It was found that the resolving power of the two plates containing hydroquinone and Methylene Blue was 12.5/mm, both after 6 months and after 1 year, and the resolving power of the printing plate containing no polymerization inhibitor was 4/mm after 6 months and 0/mm after one year.

EXAMPLE 9

An autoclave was charged with 850 g of ε-caprolactam, 590 g of hexamethylene diammonium adipate, 250 g of dimethyl 5-(sodium sulfo)isophthalate and 100 g of a 76 percent aqueous solution of hexamethylene diamine. The system was reacted for 2 hours at 160°C. and 6 atmospheres and then for an additional 2 hours at 190°C. at 12 atmospheres. After relasing the pressure, the system was further reacted while passing nitrogen there through at 270°C. for 4 hours to form a polyamide having a molecular weight of 12,600.

150 g of this polyamide, 20 g of N,N'-methylenebisacrylamide, 3 g of tri(N-acryloyl) hexahydrotriazine, 15 g of diacetone acrylamide, 6 g of benzophenone and 0.15 g of gallic acid were dissolved in 500 ml. of methanol by heating, and the solution was cast onto a Petri dish and dried by blowing air at 40°–50°C. thereon for 16 hours to form a sheet of the polyamide composition. The sheet was cut into granular particles about 2 cm × 2 cm, and pressed at 150 Kg/cm$^2$ and 120°C. to form a sheet having a thickness of 0.75 mm.

This sheet was bonded with an epoxy adhesive to an aluminum plate in the same way as in Example 1, and exposed and developed to form a relief having a sharp image.

The same results were obtained when the above procedure was repeated using tri(N-methacryloyl) hexahydrotriazine instead of tri(N-acryloyl) hexahydrotriazine.

EXAMPLE 10

An autoclave was charged with 50 g of ε-caprolactam, 30 g of hexamethylene diammonium adipate, 15.4 g of potassium 3,5-di(carbomethoxymethyl) benzensulfonate and 6.4 g of hexamethylenediamine, and a copolyamide was prepared in the same way as in Example 7.

Using 60 g of this polyamide, the same procedure as in Example 7 was followed except that a 400 W Xenon lamp was used instead of a high pressure mercury arc lamp. The resolving power of the relief obtained was 16/mm.

The above procedure was repeated except that instead of potassium di(carboxymethyl)benzene sulfonate the corresponding sodium or trimethylbenzyl ammonium salt was used in preparing the polyamide. There was again obtained a relief having a sharp image.

EXAMPLE 11

100 g of the copolyamide obtained in Example 7, 15 g of m- phenylenebisacrylamide and 2 g of benzophenone were dissolved in 300 ml. of methanol, and the solution obtained was transferred to a Petri dish and dried for one day at 30°C. at reduced pressure to remove methanol. The dried product was pulverized and compression molded at 140°C to form a plate having a thickness of 1 mm. This plate was bonded to an aluminum plate with an epoxy adhesive to form a photosensitive printing plate. A negative transparency was intimately adhered to the surface of this plate, and the plate was exposed to photoirradiation by a 1 KW high pressure mercury arc lamp for 5 minutes at a distance of 80 cm. After exposure, the unexposed areas of the plate were removed by washing with warm water at 50°C. A relief 1 mm in depth which was a faithful reproduction of the negative film was obtained. The same results were obtained when the above procedure was repeated using p-phenylenebisacrylamide, m-phenylenebismethacrylamide or p-phenylenebismethacrylamide instead of m-phenylenebisacrylamide, i.e., there was again obtained a relief having a sharp image.

EXAMPLE 12

A relief was prepared in the same way as in Example 11 using 100 g of the copolyamide obtained in Example 10, 15 g of N,N'-methylenebisacrylamide, 10 g of hexamethylenebismethacrylamide, 10 g of N-methylolacrylamide, 2 g of diphenylazomethane and 0.2 g of hydroquinone. When printing was performed using this relief there was obtained an image which was a faithful reproduction of the negative transparency used.

The same results were obtained when the above procedure was repeated using acrylamide or N-tert-butylacrylamide instead of N-methylolacrylamide.

EXAMPLE 13

A copolyamide having a molecular weight of 10,900 was prepared in the same way as in Example 7 except that instead of dimethyl 5-(sodium sulfo) isophthalate the corresponding potassium salt was used.

100 g of the copolyamide obtained, 10 g of methylenebisacrylamide, 2 g of azobisisobutyronitrile, 0.02 g of Methylene Blue and 10 g of diacetone acrylamide were dissolved in 300 g of methanol. The resulting solution was placed in a Petri dish and dried for one day at reduced pressure at 45°~50°C. The dried product was pulverized and rolled at 150 Kg/cm$^2$ and 120°C. to form a photosensitive printing plate having a thickness of 1 mm. In the same way as in Example 11 the plate was exposed to photoirradiation, and then brushed in flowing water. There was obtained a sharp relief 1 mm in depth.

The same results were obtained when Malachite Green was used instead of Methylene Blue.

EXAMPLE 14

100 g of the copolymaide of obtained in Example 7 was dissolved in 500 ml. of methanol by heating under reflux at 70°C at atmospheric pressure and, further, 0.05 g of gallic acid, 13 g of N,N'-methylenebisacrylamide, 10 g of N,N'-hexamaethylenebisacrylamide, 5 g of triethylene glycol diacrylate, 1.5 g of benzoyl peroxide and 0.1 g of 2,5-di-tert-butyl hydroquinone were added thereto to yield a homogeneous solution. The solution was transferred to a Petri dish, and a greater part of the methanol was removed at room temperature. The solution was then dried with a stream of hot air at 40°C. for one day, and then at a reduced pressure of 2 mm Hg. The dried product was powdered by means of a grinder.

The powder of the photosensitive polyamide compsotition was uniformly spread in a mold preheated to 150°C., and pressed for 20 minutes at 150 Kg/cm$^2$ at that temperature. The resulting 0.5 mm thick photosensitive printing plate having a smooth surface was bonded with an epoxy adhesive to a flat iron plate having a thickness of 0.5 mm. A half-tone negative was brought into intimate contact with the plate under vacuum conditions, and the plate was exposed to photoirradiation by a 4 KW high pressure mercury arc lamp for one minute while maintaining the distance between the light source and the plate at 80 cm. The unexposed areas were removed by washing with water. The exposed areas were obtained as a relief having a shoulder angle of about 65° and having a sharp image.

EXAMPLE 15

A photosensitive printing plate having a thickness of 1 mm was prepared in the same way as in Example 7 (except that the compression molding was carried out at 150°C. and 150 Kg/cm$^2$) using 100 g of a polyamide [prepared by the polycondensation of 100 g of ε-caprolactam, 100 g of hexamethylene diammonium adipate and 100 g of hexamethylene diammonium(5-sodium sulfo) isophthalate], 10 g of diacetone acrylamide, 10 g of N,N'-methlenebisacrylamide, 5 g of benzophenone and 0.02 g of hydroquinone. The printing plate was exposed to photoirradiation in the same way as in Example 7 and washed with water for 10 minutes using a spraying machine. There was obtained a relief having a sharp image.

EXAMPLE 16

A photosensitive prirnting plate was prepared in the same way a in Example 15 using 100 g of the polyamide prepared in Example 15, 10 g of O,N-diacryloyl-m-aminophenol 5 g of benzophenone and 0.01 g of hydroquinone, and a relief having a sharp image was prepared from the printing plate so obtained.

The same results were obtained when the above procedure was repeated except that O,N-diacryloyl-p-aminophenol, O,N-dimethacryloyl-m-aminophenol or O,N-dimethacryloyl-p-aminophenol was used instead of the O,N-diacryloyl-m-aminophenol.

EXAMPLE 17

10 g of the polyamide prepared in Example 7 was dissolved in 50 ml. of methanol, and further, 1.5 g of N,N-'-hexamethylenebiacrylamide, 0.2 g of benzophenone and 0.01 g of hydroquinone were added thereto to yield a photosensitive solution. The solution was coated on a grained aluminum plate to a thickness of 3 to 5 microns, and dried to form a lithographic printing plate. A negative transparency was brought into intimate contact with the lithographic printing plate and photoirradiation was performed by a 4000W mercury arc lamp for 10 seconds from a distance of 80 cm. After exposure, the plate was washed with tap water for 10 seconds to form a lithographic plate. Then, rubber was coated on the aluminum surface. The lithographic plate obtained exhibited good ink/water properties. In other words, the exposed portions could be easily wetted with printing ink and areas of the support corresponding to the removed unexposed portions could be easily wetted with water.

When the lithographic plate was used in offset printing using black printing ink, no abrasion that could be seen with the naked eye was observed in the plate even after 12,000 impressions, and no special care was needed during operation. Furthermore, even after this printing procedure the plate gave a clear, sharp image.

EXAMPLE 18

A polyurethane adhesive was coated on a 100 μ-thick unstretched nylon film to provide an adhesive layer having a thickness of 50 microns. A photosensitive sheet as obtained in Example 7 was placed on this adhesive layer and bonded thereto by a calender roll at 40°C. The resulting laminate was exposed to photoirradiation by a 400 W high pressure mercury arc lamp from a distance of 40 cm through a negative transparency for 2 minutes, and then washed with water. A relief having a sharp image was obtained, and adhesion to the support was excellent.

EXAMPLE 19

20 g of the copolyamide obtained in Example 7 was dissolved in 200 ml. of a 50 percent aqueous solution of methanol, and 2 g of trans-1,4-di(acryloylaminomethyl) cyclohexane, 0.6 g of benzophenone and 0.02 g of gallic acid were added thereto. Using the resulting solution, a 0.7 mm thick sheet was prepared in the same way as in Example 7. A suspension consisting of 100 g of a 20 percent methanol solution of the copolyamide produced in Example 7 and 10 g of a red colored iron oxide pigment was sprayed onto the surface of an aluminum plate to prevent halation. The photosensitive sheet was bonded to the thus obtained aluminum plate with an epoxy adhesive to produce a photosensitive resin coated plate. A negative transparency was brought into intimate contact with this resin plate, and the plate was exposed to photoirradiation by a 1 KW high pressure mercury are lamp from a distance of 30 cm for one minute. After exposure, the unexposed areas were washed with water at 30°C. and 3 Kg/cm$^2$. A sharp image was obtained which showed high fidelity to the negative. The same results were obtained when the above procedure was repeated except that cis 1,4-di(acryloylaminomethyl)cyclohexane was used instead of the trans isomer.

EXAMPLE 20

An autoclave was charged with 113 g of ε-caprolactam and 1,160 g of hexamethylenediamine, and after purging the autoclave with nitrogen, they were heated at 220°C. and at 14 atmospheres for 5 hours with stirring. The unreacted hexamethylenediamine and ε-caprolactam were removed by evaporation at 120°C. and 0.05 mmHg. The resulting product had an amino group content of 0.00860 molar equivalents/g and a carboxyl group content of 0.00011 molar equivalents/g, and corresponded to a 1:1 addition product of ε-caprolactam and hexamethylenediamine, namely, 6-oxo-7-azatridecane1,13-diamine (calculated amino group content 0.00873 equivalents/g). From the resulting nylon oligomer having an amino group at both ends and acryloyl chloride, 1,13-bis(acrylamido)-6-oxo-7-azatridecane was prepared according to the method of producing hexamethylenebisacrylamide from hexamethylenediamine and acryloyl chloride as described in Japanese Publication No. 14719/1960. This material had a melting point of 120°–123°C. And elemental analysis thereof gave the following results:

Found: C, 63.81; H, 8.96; N, 12.67; Calculated: C, 64.06; H, 9.26; N, 12.45

Using 100 g of the polyamide prepared in Example 9, 25 g of the bisacrylamide-azatridencane obtained above, 2 g of benzophenone and 0.1 g of gallic acid, a relief having a sharp image was prepared in the same way as in Example 9.

The same results were obtained when the above procedure was repeated using the corresponding methacrylamide derivative instead of 1,13-bis(acrylamido)-6-oxo-7-azatridecane.

EXAMPLE 21

An autoclave was charged with 114 g of ε-caprolactam, 18.6 g of hexamethylenediamine, 41 g of sodium-3,5-dicarboxybenzenesulfonate and 9 g of water, and the components were reacted for 3 hours at 250°C. and 39 atmospheres. The water generated was expelled, and the reaction mixture was further reacted at at the same temperature for an additional 3 hours in a nitrogen stream to form a copolyamide.

20 g of the resulting copolyamide was dissolved in 80 ml. of methanol, and 3 g of O,N-diacryloyl-m-aminophenol, 0.4 g of benzophenone and 0.01 g of hydroquinone were added thereto to prepare a photosensitive solution. The resulting solution was coated on a nylon gauze and dried to form a photosensitive screen printing plate. An image-bearing transparency was brought into intimate contact with the plate, and the plate was exposed to photoirradiation by a 400 W high pressure mercury arc lamp from a distance of 50 cm for one minute. After exposure, the unexposed areas were washed with water for 30 seconds to form a printing screen. This screen was used in 10,000 printing operations, and a printed image showing fidelity to the original image-bearing transparency was still obtained.

EXAMPLE 22

A polyamide having a molecular weight of 6,200 was prepared by the same method as in Example 7 using 40 g of ε-caprolactam, 15 g of hexamethylene diammonium 5-sodium sulfo-isophthalate, 16.4 g of 2,4-diphenoxy-6-[β-(sodium sulfo)ethylamino]-s-triazine and 4.6 g of hexamethylenediamine. Using this polyamide the same procedure as in Example 6 was followed giving a satisfactory printing relief.

The same results was obtained when the above procedure was repeated except that instead of 2,4-diphenoxy-6-[β-(sodium sulfo)ethylamino]-s-triazine the corresponding potassium salt was used.

While the invention has been described in detail and with reference to specific embodiments thereof, it will be apparent to one skilled in the art that various changes and modifications can be made therein without departing from the spirit and scope thereof.

What we claim is:

1. A photosensitive polyamide composition comprising at least one non-photosensitive polyamide copolymer, having a molecular weight of from 2,000 to 40,000, containing 2 to 50 mol percent of a monomer having pendent sulfonate salt groups with the amount of sulfonate salt group-containing comonomer being sufficient to impart water solubility or dispersibility to the polyamide, at least one unsaturated compound having at least two polymerizable ethylenic double bonds and at least one photoinitiator.

2. A photosensitive polyamide composition as claimed in claim 1 comprising 30 to 99 percent by weight of said at least one polyamide having pendant sulfonate groups, 1 to 70 percent by weight of said at least one unsaturated compound having at least two polymerizable ethylenic double bonds and 0.01 to 10 percent by weight of said at least one photoinitiator based on the total composition weight.

3. A photosensitive polyamide composition as claimed in claim 1 wherein said polyamide is obtained by reacting 50 to 98 mol percent of at least one polyamide-forming reactant with 2 to 50 mol percent of at least one triazine ring-containing compound represented by the following formula:

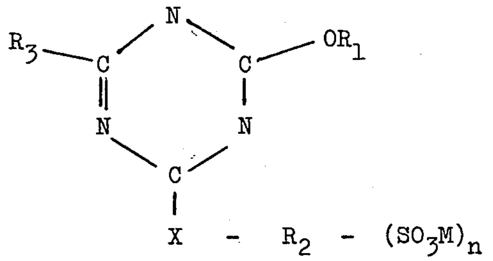

wherein $R_1$ is a monovalent aromatic group, $R_2$ is a member selected from the group consisting of $(n+1)$ valent aromatic groups and divalent aliphatic groups, X is NH,$NR_4$, wherein $R_4$ is a monovalent diphatic group, an oxygen atom or nothing, $n$ is an integer of 1 to 3, and is 1 when $R_2$ is divalent, 2 when $R_2$ is trivalent and 3 when $R_2$ is tetravlent, M is an alkali metal, an ammonium group, or an ammonium group substituted by one to four aliphatic groups or aromatic groups having one to eight carbon atoms, and $R_3$ is $OR_1$ or OH.

4. A photosensitive polyamide composition as claimed in claim 3 wherein said triazine ring-containing compound is at least one member selected from the group consisting of 2,4-diphenoxy-6-(p-sodium sulfo)-phenylamino-s-triazine, 2,4-diphenoxy-6-(p-potassium sulfo)phenylamino-s-triazine, 2-p-hydroxy-4-phenoxy-6-(p-sodium sulfo)phenylamino-s-triazine, 2-hydroxy-4-phenoxy-6-(p-potassium sulfo)phenylamino-s-triazine, 2,4-diphenoxy-6-(p-sodium sulfo)phenoxy-s-triazine, 2,4-diphenoxy-6-(p-potassium sulfo)phenoxy-s-triazine, 2,4-diphenoxy-6-[β-(sodium sulfo) ethylamino]-s-triazine and 2,4-diphenoxy-6-[β-(potassium sulfo) ethylamino]-s-triazine.

5. A photosensitive polyamide composition as claimed in claim 1 wherein said polyamide is obtained by reacting 50 to 98 mol percent of a mono-amino carboxylic acid an equi-molar mixture of diamine-dicarboxylic acid, or their amide-forming derivatives, and 2 to 50 mol percent of at least one sulfonate selected from the group consisting of aromatic and aliphatic sulfonate salts containing two amide-forming functional groups.

6. A photosenstive polyamide composition as claimed in claim 5 wherein the sulfonate salt is an alkali metal sulfonate.

7. A photosensitive polyamide composition as claimed in claim 5 wherein the sulfonate salt is at least one member selected from the group consisting of sodium-3,5-dicarboxybenzene sulfonate, potassium-3,5-dicarboxybenzenesulfonate, sodium-3,5-dicarbomethoxybenzene sulfonate, potassium-3,5-dicarbomethoxybenzene sulfonate, sodium-3,5-dicarbomethoxymethylbenzene sulfonate and potassium-3,5-dicarbomethyoxymethylbenzene sulfonate.

8. A photosensitive polyamide composition as claimed in claim 3 wherein the polyamide-forming reactant is at least one member selected from the group consisting of aminocaproic acid, epsilon-caprolactam, hexamethylene diammonium adipate, hexamethylene diammonium sebacate and m-xylylene diammonium adipate.

9. A photosensitive polyamide composition as claimed in claim 7 wherein the polyamide having pendant sulfonate salt groups is a copolyamide composed of 35 to 70 percent by weight of Nylon 6, 10 to 40 percent by weight of Nylon 66 and 15 to 50 percent by weight of poly[hexamethylene (5-sodium sulfo) isophthalamide].

10. A photosensitive polyamide composition as claimed in claim 1 wherein said at least one unsaturated compound is at least one compound expressed by the following formula $$CH_2 = \underset{R}{C} - \underset{O}{\overset{}{C}} - \underset{H}{N} - X - \underset{H}{N} - \underset{O}{C} - \underset{R'}{C} = CH_2$$

wherein X is a divalent group having an aliphatic, alicyclic or aromatic group with 1 to 10 carbon atoms, and R and R′ are a hydrogen atom or a lower alkyl group having one to five carbon atoms.

11. A photosensitive polyamide composition as claimed in claim 10 wherein said at least one unsaturated compound is at least one member selected from the group consisting of N,N′-methylenebisacrylamide, N,N′-hexamethylenebisacrylamide, N,N′-hexamethylene bismethyacrylamide, cis- and trans-1,4-di(acryloylaminomethyl)-cyclohexane, N,N′-m-xylylenebisacrylamide, N,N′-p-xylylenebiscarylamide, N,N′-p-xylylenebismethacrylamide, N,N′-m-phenylenebismethacrylamide, N,N′-p-phenylenebismethacrylamide, N,N′-m-phenylenebisacrylamide and N,N′-p-phenylenebisacrylamide.

12. A photosensitive polyamide composition as claimed in claim 1 wherein said at least one unsaturated compound having at least two polymerizable ethylenic double bonds is at least one compound expressed by the following formula.

$$CH_2 = \underset{R}{C} - \underset{O}{C} - \underset{H}{N} - X - O - \underset{O}{C} - \underset{R'}{C} = CH_2$$

wherein X is a divalent aliphatic, alicyclic or aromatic group having one to eight carbon atoms, and R and R′ are a hydrogen atom or an alkyl group having one to five carbon atoms.

13. A photosenstive polyamide composition as claimed in claim 12 wherein said at least one unsaturated compound having at least two polymerizable double bonds is at least one member selected from the group consisting of O,N-diacryloyl-m-aminophenol, O,N-diacryloyl-p-aminophenol, O,N-dimethacryloyl-m-aminophenol and O,N-dimethacryloyl-p-aminophenol.

14. A photosensitive polyamide composition as claimed in claim 1 wherein said at least one unsaturated compound having at least two polymerizable ethylenic double bonds is at least one member selected from the group consisting of an α,ω-bis-N-acrylated compound and an α,ω-bis-N-methacrylated compound of a nylon oligomer having a terminal amino group at both ends.

15. A photosensitive polyamide composition as claimed in claim 14 wherein said at least one unsaturated compound having at least two polymerizable ethylenic double bonds is at least one member selected from the group consisting of 1,3-bis-acrylamido-6-oxo-7-azatridecane and 1,3-bis-methacrylamido-6-oxo-7-azatridecane.

16. A photosensitive polyamide composition as claimed in claim 1 wherein said at least one photoinitiator is at least one member selected from the group consisting of benzophenone, benzoin methyl ether, diphenyl azomethane, benzoyl peroxide, azobisisobutyronitrile and benzoyl benzophenone.

17. A photosensitive polyamide composition as claimed in claim 1 which further comprises a compound having one polymerizable ethylenic double bond in an amount of 1 to 50 percent by weight based on the total composition weight.

18. A photosensitive polyamide composition as claimed in claim 17 wherein said at least one compound having one polymerizable ethylenic double bond is at least one member selected from the group consisting of acrylamide, N-methylolacrylamide, N-t-butylacrylamide and diacetone acrylamide.

19. A photosensitive polyamide composition as claimed in claim 1 wherein said unsaturated compound having at least two polymerizable ethylenic double bonds is at least one member selected from the group consisting of tri-(N-acryloyl) hexahydrotriazine and tri(N-methacryloyl) hexahydrotriazine.

20. A photosensitive polyamide composition as claimed in claim 1 which further contains 0.005 to 2 percent by weight, based on the total composition weight, of at least one polymerization inhibitor selected from the group consisting of hydroquinone, Methylene Blue, gallic acid, n-propyl gallate, isoamyl gallate, 2,5-tert-butyl hydroquinone and Malachite Green.

21. A photosensitive polyamide composition as claimed in claim 5 wherein said aromatic and aliphatic sulfonate salts containing two amide forming groups are selected from compounds represented by the formulae:

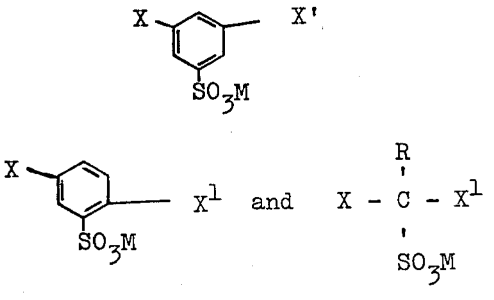

wherein M is an alkali metal, an ammonium group or an ammonium group substituted by one to four aliphatic and/or aromatic groups having one to eight carbon atoms; R is a hydrogen atom or an alkyl group having one to five carbon atoms; and X and X′ are amide-forming functional groups from the class:

COOH, $R^1COOH$ where $R^1$ is a $C_1$–$C_5$ alkylene group;

$COOR^2$, where $R^2$ is a $C_1$–$C_5$ alkyl group;

$R^3COOR^4$ where $R^3$ is a $C_1$–$C_5$ alkylene group and $R^4$ is a $C_1$–$C_5$ alkyl group; and $R^5NH_2$ where $R_5$ is a $C_1$–$C_5$ alkylene group.

* * * * *